United States Patent
Owen et al.

[11] Patent Number: 6,014,014
[45] Date of Patent: Jan. 11, 2000

[54] STATE-OF-CHARGE-MEASURABLE BATTERIES

[75] Inventors: Geraint Owen, Palo Alto, Calif.; Timothy F. Myers, Philomath, Oreg.

[73] Assignee: Hewlett-Packard Company, Palo Alto, Calif.

[21] Appl. No.: 09/181,797

[22] Filed: Oct. 28, 1998

[51] Int. Cl.[7] .............. H02J 7/00; H01M 10/34; G01N 27/416
[52] U.S. Cl. ............ 320/132; 320/110; 320/125
[58] Field of Search ............ 370/110, 132, 370/125; 324/427

[56] References Cited

U.S. PATENT DOCUMENTS

| 5,625,291 | 4/1997 | Brink et al. | 429/427 |
| 5,633,573 | 5/1997 | VanPhouc et al. | 320/128 |
| 5,733,674 | 3/1998 | Law et al. | 429/9 |
| 5,850,134 | 12/1998 | Oh et al. | 320/106 |

*Primary Examiner*—Peter S. Wong
*Assistant Examiner*—Gregory J. Toatley, Jr.

[57] ABSTRACT

A storage device allows the state of charge of a main battery to be determined by measuring the state of charge of a dummy battery. The storage device may provide power to an electronic appliance such as a portable computer. The main and dummy batteries each have a storage capacity and a self-discharge rate. The storage capacity of the dummy battery is less than the storage capacity of the main battery; for example, the storage capacity of the dummy battery may be only about 1% of that of the main battery. The main and dummy batteries are configured so that the self-discharge rates thereof are substantially equal. The storage device also includes discharge circuitry which is configured so that the dummy battery discharges at a rate faster than the main battery when a load is connected to and drawing current from the main battery.

20 Claims, 5 Drawing Sheets

STATE-OF-CHARGE-MEASURABLE BATTERIES

FIELD OF THE INVENTION

The present invention is related to batteries and, more particularly, to batteries for providing power to electronic appliances such as portable computers. The present invention is also related to batteries that can be measured for state of charge. The batteries and associated state-of-charge measuring methods of the invention are particularly applicable to thin-film batteries.

BACKGROUND OF THE INVENTION

It is often desirable to measure the "state of charge" of a battery. By performing such a measurement, one is able to determine the remaining lifetime of the battery. For example, a user of a portable electronic device such as a laptop computer may like to know when the battery powering the device is running low so that the battery can be recharged or replaced with a fully charged battery.

Measuring the state of charge of a battery is a surprisingly difficult thing to do. One reason for this is that a battery does not, in fact, store charge but rather stores chemical energy. The stored chemical energy is converted to electrical energy when a load is connected across the terminals of the battery. The efficiency at which a battery converts chemical energy to electrical energy is known as "conversion efficiency." In other words, the conversion efficiency of a battery indicates the percentage of stored chemical energy which is converted to electrical energy. Because of certain inefficiencies, batteries typically are not able to achieve a conversion efficiency of 100%. Moreover, conversion efficiency depends significantly on the temperature of the battery, the current drain presented by the load connected across the terminals, and the state of charge. Accordingly, a battery cannot in reality be regarded simply as a reservoir of charge.

Further complicating the measurement of state of charge, batteries discharge energy even in the absence of a load. The discharge of energy in the absence of a load is known as self-discharge. Depending upon the type of battery, the rate at which batteries self-discharge can vary from less than 1% per year to several percent per week. Accordingly, it is difficult to predict and to compensate for changes in charge resulting from self-discharge.

An example of a conventional state-of-charge indicator is a hydrometer used with a lead-acid car battery. At a given temperature, the concentration of the electrolyte in the battery is a good indicator of state of charge. The electrolyte concentration is directly related to the specific gravity of the electrolyte. The hydrometer measures the specific gravity. Temperature effects are taken into account by applying a correction factor, which needs to be looked up in a table. The use of a hydrometer is generally perceived to be too messy for use in consumer or portable products; accordingly this type of technique is not applicable in these areas.

A conventional noninvasive method for measuring state of charge of a battery is to measure the open-circuit voltage of the battery. A disadvantage of this approach is that it cannot be used when the device is running, since the measurement is made when the battery is off-load. In addition, the open-circuit voltage takes minutes or even hours to stabilize after a load has been disconnected. Moreover, the open-circuit voltage of many types of modern batteries is only loosely related to the state of charge, until just before the battery is completely discharged. Thus, it is difficult to obtain reasonable notice that the battery is running low using this technique.

Another method for measuring open-circuit voltage of a battery involves first stressing the battery with a high discharge for a short length of time using a special load in an attempt to overcome the stabilization time problem. However, this technique is not practical if battery lifetime is an issue.

Other methods for measuring state of charge include "charge accounting." Charge accounting is a technique based on the assumption that a battery conserves charge. Fuel gauges using charge-accounting techniques are widely used in equipment such as lap-top computers. However, imperfections of battery models resulting from variations in the manufacturing process do not allow fuel gauges to perform particularly well. To compensate for this inaccurate performance, batteries are sometimes assumed to be able to hold only 70% of their actual charge capacity in order to give a safety margin of 30%. Accordingly, a substantial portion of the charge capacity may not be utilized. In addition, variations in parameters from battery to battery, even variations in the same type of battery made by the same manufacturer, as well as battery aging, inhibit accurate measurement of charge by conventional fuel gauges using charge accounting.

In view of the foregoing, it is apparent that there is still a need for a storage device or battery that can be measured for state of charge easily and accurately.

SUMMARY OF THE INVENTION

The present invention may be regarded as a storage device that allows state of charge to be measured. More specifically, the storage devices of the present invention enable the accurate measurement of state of charge so that the current charge capacity of the storage device may be precisely determined. By measuring state of charge accurately and providing an indication of the current state of charge, a user knows when the storage device is running low on charge so that the storage device may be recharged or replaced with a fully charged battery. Such accurate measurement of state of charge enhances the convenience of using electronic appliances such as portable computers.

According to one aspect of the present invention, a storage device includes a main battery connectable to a load and a dummy battery. The load may be, for example, a portable computer or other electronic appliance. The main and dummy batteries each have a storage capacity and a self-discharge rate. The storage capacity of the dummy battery is less than the storage capacity of the main battery; for example, the storage capacity of the dummy battery may be only about 1% of that of the main battery. The main and dummy batteries are configured so that the self-discharge rates thereof are substantially equal. The storage device also includes discharge circuitry connected to the dummy battery. The discharge circuitry is configured so that the dummy battery discharges at a rate faster than the main battery when a load is connected to and drawing current from the main battery.

One of the advantages of this storage device of the invention is that the voltage of the dummy battery may be monitored to determine when the main battery is running low on charge. When the voltage of the dummy battery has decreased below a predetermined threshold, then a signal may be provided to indicate that the main battery will soon approach a low-power state. Accordingly, if the storage device is implemented in, for example, a portable computer, a user will know when the storage device is about to discharge so that the storage device may be recharged or replaced.

Another advantage of the present invention is that the discharge circuitry may be configured so that the dummy battery will discharge at a predetermined rate more quickly than the main battery. Accordingly, when the dummy battery has discharged below the predetermined threshold, one may determine the amount of charge remaining in the main battery and how much longer the main battery will provide power the load.

Other aspects, features, and advantages of the present invention will become apparent to those persons having ordinary skill in the art to which the present invention pertains from the following description taken in conjunction with the accompanying drawings.

DETAILED DESCRIPTION OF THE INVENTION

The present invention is embodied in a storage device, an exemplary embodiment being a thin-film storage device. The storage device may be utilized in a number of applications. For example, the thin-film storage device may be used to provide power to a portable computer, such as a lap-top, palm-top, or notebook computer. The storage device of the present invention enables accurate measurement of state of charge. Accordingly, one is able to determine when charge is running low so that the storage device may be recharged or replaced with a fully charged battery. The present invention provides this function while maximizing storage capacity and minimizing or substantially eliminating measurement error. While the present invention is exemplified herein utilizing thin-film technology, those skilled in the art will appreciate that other storage device technology may be used, such as NiMHy, Li-Ion, Ni-Cad, Zinc-Air, Lithium Polymer, and Lead-acid technologies.

Figure 1:
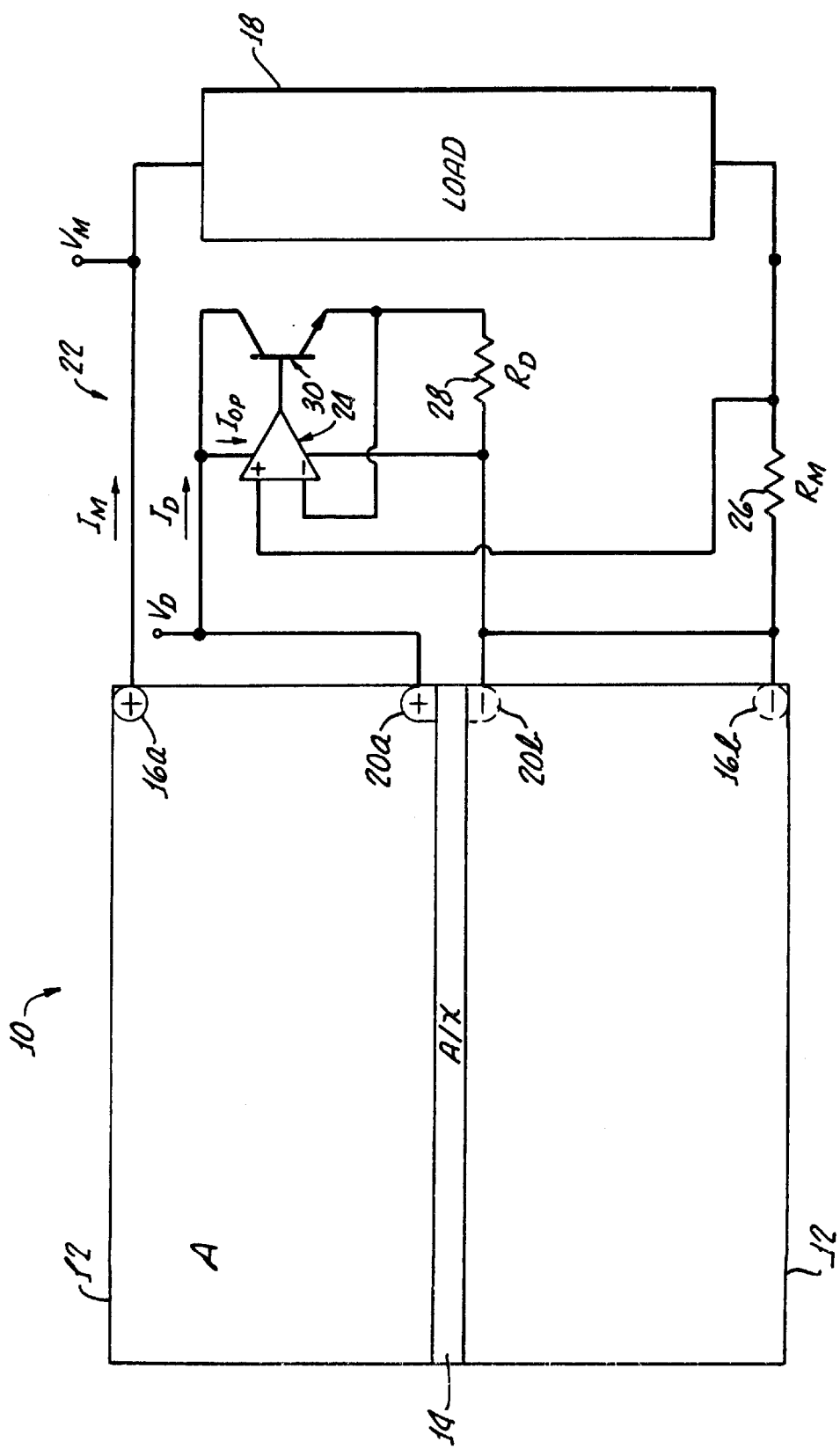
FIG. 1 is a schematic view of an exemplary storage device in accordance with the invention, particularly illustrating a low-power indicator embodiment of the storage device.
Figure 2:
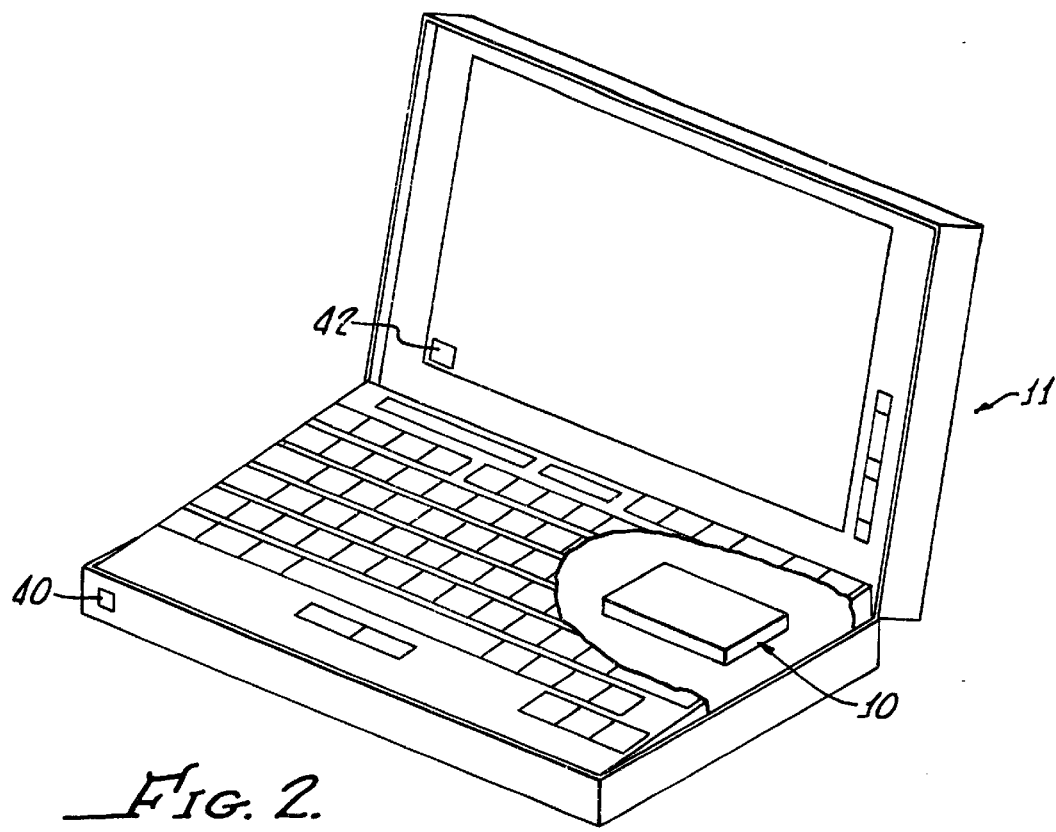
FIG. 2 is a fragmentary perspective view of a portable computer configured in accordance with the present invention.

Referring to the drawings in more detail, an exemplary embodiment of a storage device 10 of the present invention is illustrated schematically in FIG. 1. The storage device 10 is shown in an exemplary application in a portable computer 10 in FIG. 2. Exemplary storage device 10 includes a main battery 12 and a dummy battery 14. The main battery 12 may have a pair of terminals 16a and 16b to which a load 18 is connectable. The dummy battery 14 may have a pair of terminals 20a and 20b to which discharge circuitry 22 is connectable.

Exemplary storage device 10 is configured so that the dummy battery 14 discharges more quickly than the main battery 12 when a load is connected to and drawing current from the main battery 12. Such a configuration of the storage device 10 results in the state of charge of the dummy battery 14 being indicative of the state of charge of the main battery 12. Accordingly, by monitoring the state of charge of the dummy battery 14, one is able to determine when the state of charge of the main battery 12 is at a low level, which may be thought of as a "low-power indicator." When the main battery 12 is determined to be at a low level, a low-power signal may be provided to warn a user, which will be discussed in more detail below. In addition to being applicable to the low-power indicator embodiment shown in FIG. 1, the principles of the present invention are also applicable to "fuel gauges" for measuring the level of charge of the main battery 12, which will be discussed in more detail below.

In the embodiment of the storage device 10 shown in FIG. 1, the dummy battery 14 is in the form of a strip which essentially divides the main battery 12 into two portions. Alternatively, the dummy battery 14 may be in the form of a cell surrounded by the main battery 12. Regardless of the specific configuration, it is preferable for the dummy battery 14 to be physically smaller than the main battery 12. In other words, the dummy battery 14 has a volume which is less than that of the main battery 12 and, therefore, a smaller charge capacity. As the batteries 12 and 14 are preferably thin-film batteries with substantially the same thickness, the thickness of the batteries 12 and 14 will be ignored for purposes of this description, and the relative sizes of the batteries 12 and 14 will be described in reference to a respective physical area of each.

It is also preferable for the two batteries 12 and 14 to be made by substantially identical processes to minimize or substantially eliminate manufacturing tolerances therebetween. In addition, the batteries 12 and 14 are preferably arranged so as to share substantially the same ambient environment. Accordingly, the main and dummy batteries 12 and 14 have substantially the same self-discharge rates. The self-discharge rate for a battery is the rate at which the battery discharges in the absence of a load.

With continued reference to FIG. 1, the main battery 12 has a physical area A and a charge capacity $Q_M$, and the dummy battery 14 has a charge capacity $Q_D$. The physical area of the dummy battery 14 is substantially less than the area of the main battery 12 and is indicated by A/x, where x is a number greater than 1. For example, if x is 100, than the area of the dummy battery 14 is 1% of the area A of the main battery 12. It follows that the charge capacity $Q_D$ of the dummy battery 14 is substantially less than the charge capacity $Q_M$ of the main battery 14. In other words, the charge capacity $Q_D$ of the dummy battery 12 is a fraction of the charge capacity $Q_M$ of the main battery 12, which fraction is indicated by $\alpha$. Thus, the charge capacities of the main and dummy batteries 12 and 14 are related by:

$$Q_D = \alpha Q_M.$$

It is preferable to maximize the area A of the main battery 12, thereby maximizing the charge capacity $Q_M$ of the main battery 12 to power an electronic appliance. Accordingly, the area A/x of the dummy battery 14 is minimized with respect to the area A of the main battery 14 to reserve as much capacity as possible in the main battery 14 to provide power to the load 18. Although relatively large percentages are possible, the area of the dummy battery 14 is preferably less than about 5% of the area of the main battery 12 and, more preferably, less than about 1% of the area of the main battery. Accordingly, the charge capacity $Q_D$ of the dummy battery 14 is preferably less than about 5%, or more preferably less than about 1%, of the charge capacity $Q_M$ of the main battery 12. In other words, to maximize the storage capacity $Q_M$ of the main battery 12 with respect to the storage capacity $Q_D$ of the dummy battery 14, $\alpha$ is preferably less than about 0.01.

Figure 3:
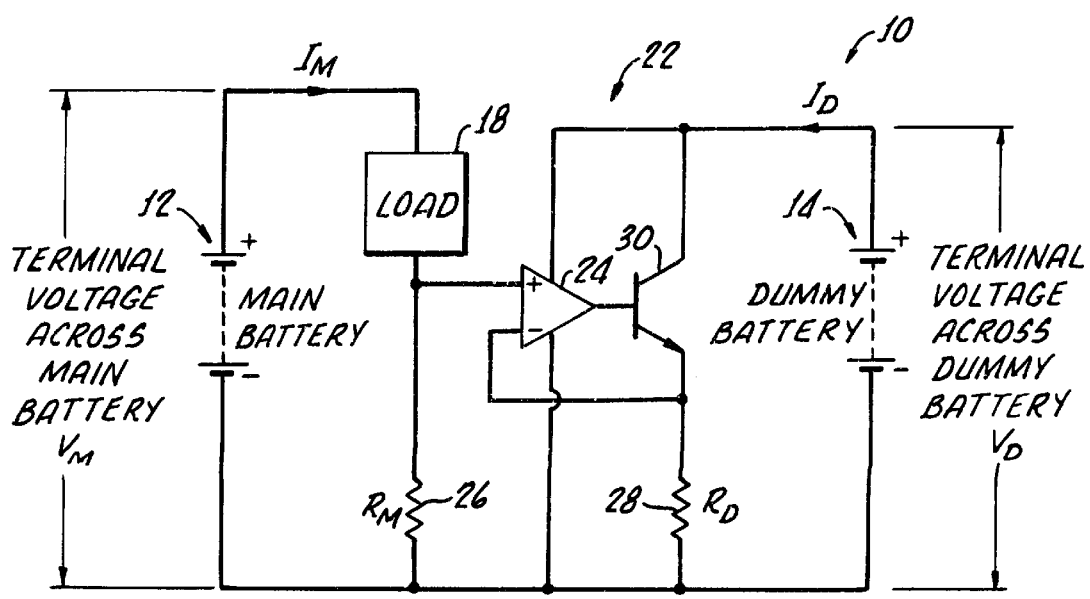
FIG. 3 is a schematic view of another exemplary low-power-indicator storage device of the invention.

With reference to FIG. 3, a schematic representation of the storage device 10 is shown to include the dummy battery 14 and the main battery 12. Reference will be made to this schematic representation to describe operational principles of the present invention, which will then be applied to the exemplary embodiment of the low-power indicator storage device 10 of FIG. 1.

The discharge circuitry 22 draws a current $I_D$ from the dummy battery 14, which current is a fixed fraction $\beta$ of a current $I_M$ drawn from the main battery 12. The discharge circuitry 22 may include an operational amplifier (or "op amp") 24 which has an input impedance and a gain that are effectively infinite; accordingly, the voltage across the differential input of the op amp 24 is effectively zero. The op amp 24 is chosen so that the quiescent supply current drawn thereby is negligible in comparison to current $I_D$. Thus, under these circumstances:

$$\beta = I_D/I_M = R_M/R_D,$$

where $R_M$ and $R_D$ are the values of sense resistors 26 and 28 respectively associated with the main and dummy batteries 12 and 14.

Figure 4:
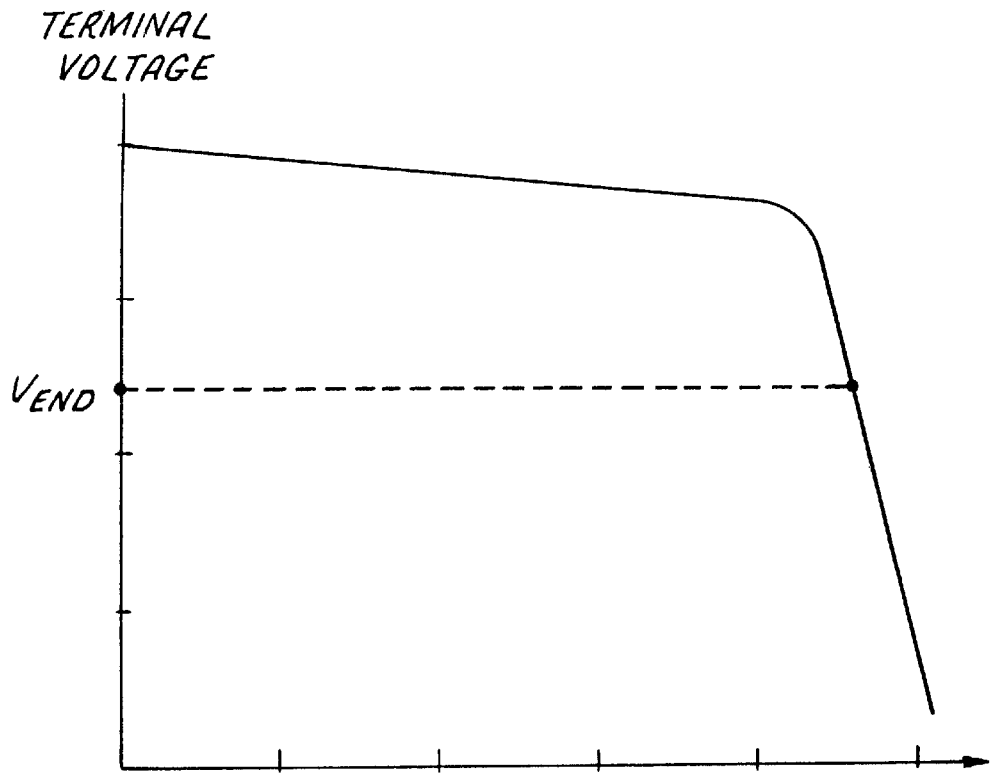
FIG. 4 is a graph illustrating discharge characteristics of the storage devices of the present invention.

With reference to FIG. 4, the discharge characteristics of the batteries 12 and 14 are illustrated. The terminal voltages of the batteries 12 and 14 decline slowly with state of charge during the useful part of the battery discharge cycle. Eventually, the voltage drops off dramatically. The value of $V_{end}$ is selected to be the lowest voltage at which the device loading the main battery 12 will function reliably. Thus, when the respective terminal voltages of the batteries 12 and 14 have decreased to $V_{end}$, the battery has, for practical purposes, completely discharged.

As mentioned above, it is preferable to maintain the main and dummy batteries 12 and 14 at the same temperature as much as possible (which temperature may vary with time) and to form the batteries 12 and 14 of substantially the same chemistries. Accordingly, if $\alpha = \beta$, then the main battery 12 and the dummy battery 14 track each other while discharging. Also, the self-discharge rates of the batteries 12 and 14 are substantially the same. Moreover, the normalized load currents of the batteries 12 and 14 are forced to be equal. Therefore, if both the main battery 12 and the dummy battery 14 start off fully charged, then the terminal voltages $V_M$ and $V_D$ of the batteries 12 and 14, respectively, are substantially equal as the batteries discharge. In particular, the respective terminal voltages $V_M$ and $V_D$ of the batteries 12 and 14 decrease to $V_{end}$ at substantially the same time.

In accordance with the present invention, the discharge circuit 22 ensures that the dummy battery 14 discharges at a rate more quickly (for example, about 10% more quickly) than the main battery 12. This discharge rate, as opposed to the self-discharge rate, is the rate at which the batteries 12 and 14 discharge when the load 18 is drawing current therefrom. This accelerated discharge rate may be accomplished by setting $\beta = 1.1\alpha$. In this embodiment, the terminal voltage $V_D$ of the dummy battery 14 decreases to $V_{end}$ sooner than the terminal voltage $V_M$ of the main battery 12. Accordingly, by monitoring the terminal voltage $V_D$ of the dummy battery 14, when the terminal voltage $V_D$ has decreased to $V_{end}$, then the main battery 12 will run out in a relatively short period of time. If the self-discharge rate of the batteries 12 and 14 is negligible (when compared to the discharge rates when connected to the load), then it can be estimated that when the terminal voltage $V_D$ of the dummy battery 14 has decreased to $V_{end}$, that the main battery 12 has lost $1.0/1.1 \times 100 = 91\%$ of the initial charge thereof. Thus, for the portable computer 10 with a projected battery life of about three hours, a low-power signal may be provided about $180 \times 0.09 = 16.2$ minutes prior to the main battery 14 running out of charge (or prior to $V_M$, substantially equaling $V_{end}$).

Figure 5:
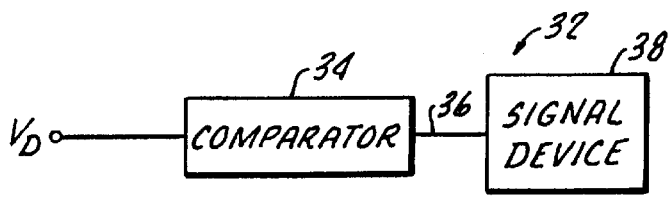
FIG. 5 is a schematic view of signaling circuitry of the invention for providing a low-power signal.
Figure 6:
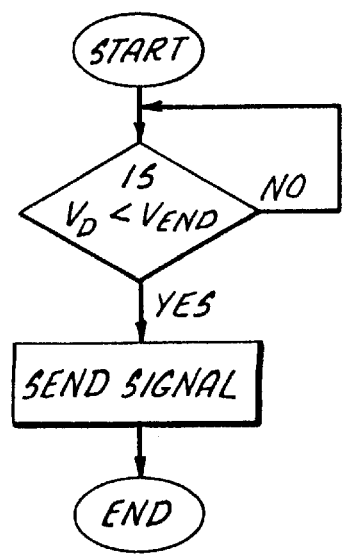
FIG. 6 is a flowchart illustrating a monitoring process to determine when to provide a low-power signal.

With regard to providing a low-power signal, reference is made to FIG. 5 which illustrates signaling circuitry 32. The signaling circuitry 32 may include a comparator 34 which monitors the level of the terminal voltage $V_D$ of the dummy battery 14 with respect to the predetermined threshold voltage $V_{end}$, as shown in FIG. 6. When the terminal voltage of the dummy battery 14 is greater than the threshold voltage Vend, then no low-power signal is provided. When the terminal voltage $V_D$ of the dummy battery 14 decreases to a value less than the threshold voltage Vend, then the comparator 34 provides a low-power signal 36 to a signaling device 38. The low-power signal 36 indicates that the main battery 14 will substantially run out of charge in a predetermined period of time, for example, in about 15 minutes to 20 minutes in the exemplary embodiment discussed above.

The signal device 38 may be configured as any desired warning device, for example, an audible device, such as a speaker, or a visual device, such as a warning light, or a combination of both. For example, in the embodiment of the storage device 10 of the invention powering the portable computer 10 of FIG. 2, the comparator 34 may provide the low-power signal 36 to a speaker 40 of the computer 10 to emit an audible low-power warning signal. Alternatively, the comparator 34 may provide the low-power signal 36 to the display of the computer 11, or to a portion of the display as indicated by reference numeral 42, to warn the user visually of low power. In this embodiment, the comparator 34 may be a dedicated component, or the function of the comparator 34 may be carried out by the processor of the computer 11.

An exemplary embodiment of the discharge circuitry 22 of FIG. 3 will now be provided. In addition to the op amp 24, exemplary discharge circuitry 22 may include a transistor 30, with a base thereof connected to an output of the op amp 24 and a collector and an emitter thereof connected across the dummy battery 14. The transistor 30 provides current amplification to drive the dummy sense resistor 28. The main sense resistor 26 may have a value of $R_M = 1$ 6, and the dummy sense resistor 28 may have a value of $R_D = 10$ 6. Accordingly, a ratio is defined as the main current $I_M$ to the dummy current $I_D$ is about 10:1. Any other desired values of the sense resistors 26 and 28 may be selected to result in any desired ratio between the main and dummy currents $I_M$ and $I_D$. An example of a commercially available operation amplifier for use as the op amp 24 is a micropower single-supply rail-to-rail input/output operational amplifier manufactured by Analog Devices, model OP291.

With further reference to FIG. 1, exemplary values of the various components of the storage device 10 will now be provided. As mentioned, the area of the main battery 12 is A and the area of the dummy battery 14 is A/x, where x may equal about 100, for example. Thus, the area of the dummy battery 14 is 0.01A. Accordingly, the ratio of the capacities of the main and dummy batteries 12 and 14, which is represented by α, is α=0.01. Exemplary values for the sense resistors 26 and 28 for the main and dummy batteries 12 and 14, respectively, may be $R_M$=0.11Ω and $R_D$=10 Ω. According, the ratio β of currents $I_M$ and $I_D$ flowing from the main and dummy batteries 12 and 14, respectively, is β=$R_M$/$R_D$=0.11/10 =0.011. Thus, in the exemplary embodiment of the storage device 10 of the present invention shown in FIG. 1, α=0.01 and β=0.011, with β/α=1.1. Accordingly, the dummy battery 14 will be run down approximately 10% more quickly than the main battery 12.

As shown, the op amp 24 is powered by the dummy battery 14. The current drawn by the op amp 24, which is represented by $I_{OP}$, in the exemplary embodiment shown in FIG. 1 is between about 200 μA and about 500 μA. The op amp current $I_{OP}$ presents an additional load on the dummy battery 14. This additional load on the dummy battery 14 accelerates the rate at which the dummy battery 14 is discharged. Alternatively, the op amp 24 may be powered by the main battery 12. A further alternative is to power the op amp 24 by a separate battery, such as a low-capacity primary battery having a low self-discharge rate, for example, a real-time clock battery typically found in notebook computers and other electronic devices.

Power from the dummy battery 14 does not enter the load 18 but is dissipated in op amp 24, the dummy sense resistor 28, and the transistor 30. Consequently, the area A/x occupied by the dummy battery 14 may not necessarily be utilized by the load 18. In addition, the overall capacity of the storage device 10 shown in FIG. 1 may be reduced to about 99% (i.e., 100/10 1) of what the capacity of the storage device would be without the implementation of the low-power indicator.

Figure 7:
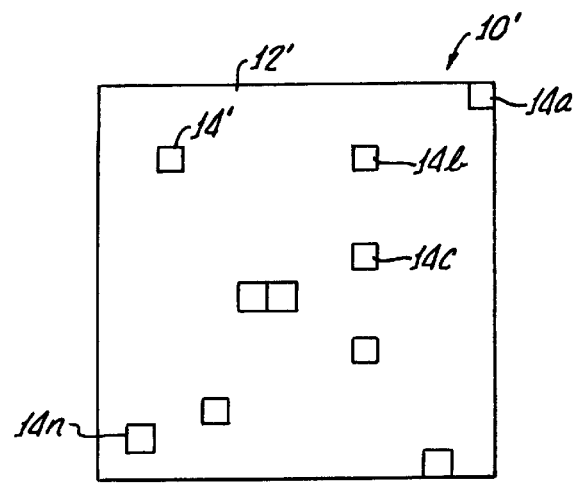
FIG. 7 is a schematic view of yet another exemplary storage device of the invention, particularly illustrating cell-based dummy batteries.

An alternative embodiment of the storage device 10' of the present invention is illustrated in FIG. 7. In this embodiment, rather than configuring the dummy battery 14 in the form of a strip, exemplary storage device 10' includes a main battery 12' and at least one dummy battery 14' in the form of a cell either nested within the main battery 12' or at an edge thereof. Alternatively, the storage device 10' may include a plurality of dummy batteries 14a, 14b, 14c, ... 14n distributed either in a predetermined arrangement or in a substantially random arrangement. In either case, the dummy batteries 14a–14n are preferably isolated electrically but not thermally isolated from the main battery 12'. In other words, the dummy batteries 14 share substantially the same ambient environment as the main battery 12' to ensure substantially the same self-discharge rates, but may be individually connected electrically to each have a terminal voltage separate from that of the main battery 12'.

The combined areas of the dummy batteries 14a–14n occupy a predetermined percentage of the total area of the storage device 10', for example, less than about 5% or, more preferably, less than or equal to about 1% of the total area. The terminal voltage of a signal dummy battery 14a–14n may be monitored in determining when to provide a low-power signal. Alternatively, the terminal voltages of the dummy batteries 14a14 14n may be collectively monitored, or an average of the terminal voltages of the dummy batteries 14a–14n may be monitored, in determining when to issue the low-power signal.

Figure 8:
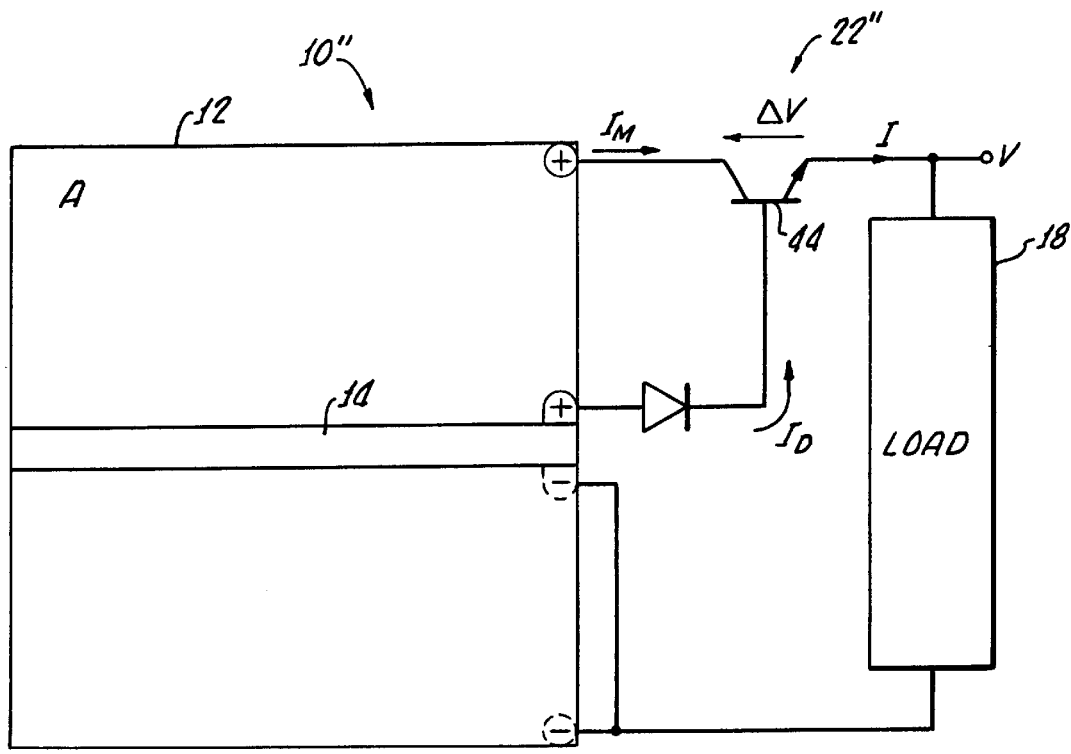
FIG. 8 is a schematic view of still another exemplary low-power-indicator storage device of the present invention.

Another alternative embodiment of the present invention is shown in FIG. 8. Exemplary storage device 10" includes discharge circuitry 22" connected between the main battery 12 and the load 18. The load 18 draws a current $I_M$ from the main battery 12 through a collector of a transistor 44 and a current $I_D$ from the dummy battery 12 through a base of the transistor 44. As discussed in the exemplary embodiment above, the area A/x of the dummy battery 14 may be about 1% of the area A of the main battery 12. If the transistor 44 has a current gain of $h_{fe}$=1/0.011≈90.91 (i.e., the ratio of the collector to base currents), then the ratio of the currents $I_M$ and $I_D$ drawn from the main and dummy batteries 12 and 14, respectively, is β=1/$h_{fe}$0.011. The discharge circuitry 22" may include a diode 46 connected between the dummy battery 14 and the transistor 44 to prevent the transistor 44 from saturating. The current gain $h_{fe}$ of the transistor 44 is chosen to allow easy control of β.

A voltage difference ΔV occurs between the collector and the emitter of the transistor 44. For typical silicon transistors, ΔV=1.4 V. This corresponds to a power dissipation of about I×ΔV in the transistor 44. The power drawn from the main and dummy batteries 12 and 14 is about I×V. Therefore, the power efficiency of the circuit is approximately (V–ΔV)/V. For example, if V=9 V and ΔV=1.4 V, then the power efficiency has a value of 84%. In a commercial embodiment of the storage device 10" of FIG. 8, the discharge circuitry 22" may include a 2N3053 transistor and a 1N4150 diode. Alternative semiconductor technology that may be utilized in the exemplary embodiments of the discharge circuitry, particularly to improve power efficiency, includes, for example, Schottky diodes and germanium diodes and transistors.

Rather than being configured as a low-power indicator as discussed above, the storage device of the present invention may be configured as a fuel gauge which provides an indication of the amount of charge available in the storage device to power an electrical appliance. In this regard, reference is made to FIG. 9 which illustrates a storage device of the present invention configured as a fuel gauge 50. The fuel gauge 50 includes a main battery 52 and a plurality of dummy batteries 54a, 54b, 54c, ... 54m, as well as discharge circuitry 60. The main battery 52 has terminals 56 which are connectable to a load 18, such as a portable electronic appliance, e.g., a portable computer. The discharge circuitry 60 is connected to the dummy batteries 54a–54m. As discussed above, the main battery 12 and the dummy batteries 54a–54m are configured to have substantially the same self-discharge rates. The discharge circuitry 60 discharges the dummy batteries 54a–54m more quickly than the main battery 52 when a load is connected to the main battery 52.

Figure 9:
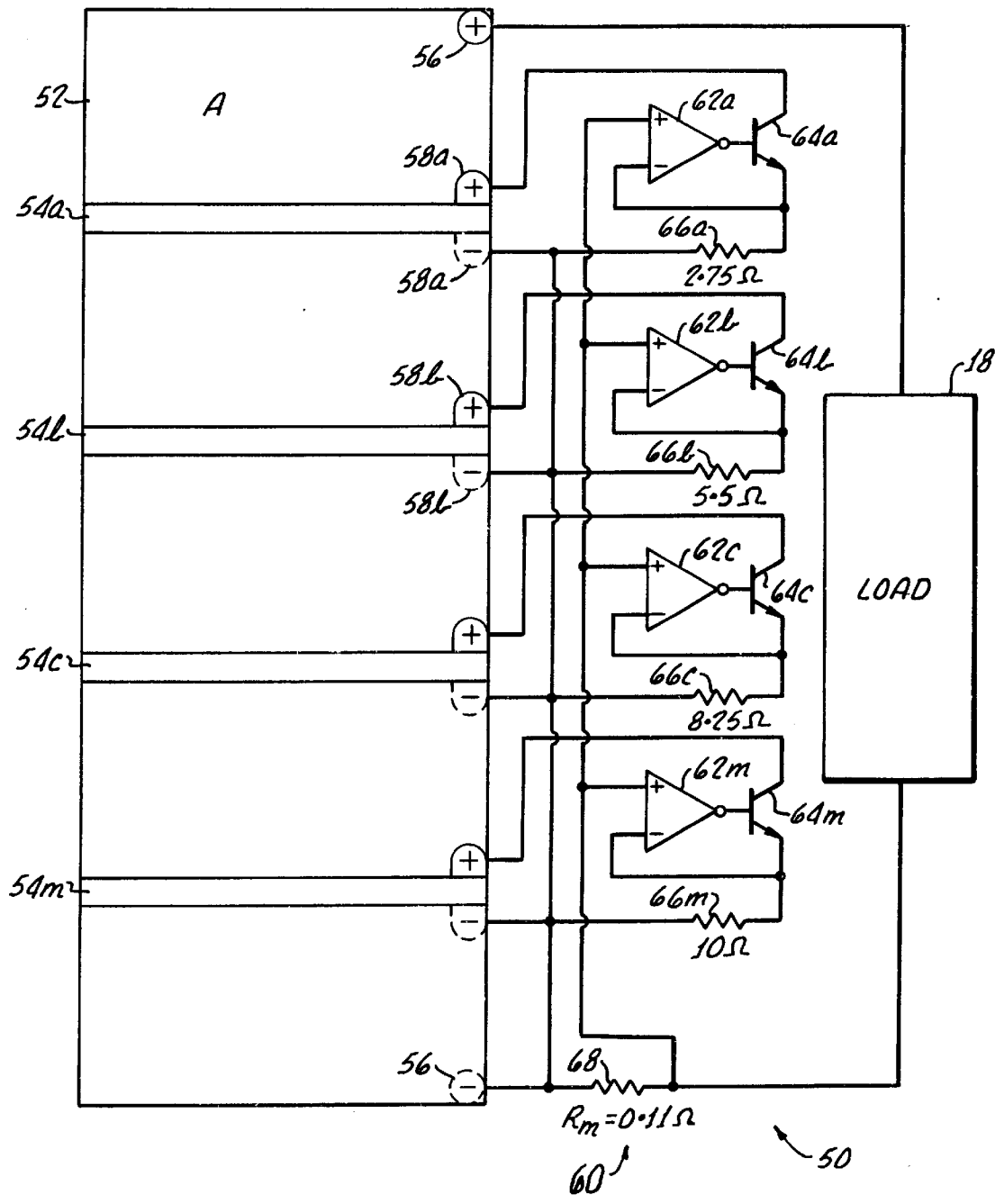
FIG. 9 is a schematic view of an exemplary storage device of the invention, particularly illustrating a fuel gauge embodiment of the storage device.

In the exemplary embodiment illustrated in FIG. 9, the fuel gauge 50 include four dummy batteries 54a–54m. Accordingly, the fuel gauge 50 may provide a gradated indication of when the state of charge of the main battery 52 is, for example, full, ¾ full, ½ full, and ¼ full. The area A/x and, hence, the capacity of each dummy battery 54a–54m may be, for example, about 1% of the capacity of the main battery 52.

The discharge circuitry 60 may include a plurality of op amps 62a–62m, a plurality of transistors 64a–64m, and a plurality of sense resistors 66a–66m, which are respectively configured as a plurality of current mirrors analogous to that shown and described in FIG. 1. Each of the dummy batteries 54 is connected for one of the current mirrors. The discharge circuitry 60 may also include a sense resistor 68 of the main battery 52.

For the purposes of this description, a specific exemplary embodiment of the fuel gauge 50 is provided with values for the sense resistors 66a–66m and 68. The main sense resistor 68 may have a value of, for example, $R_M$=0.11Ω. For dummy battery 54m, the sense resistor 66m may have a value of $R_D=10\ \Omega$. Therefore, for dummy battery 54m, $\beta=R_M/R_D=0.11/10=0.011$ and $\beta/\alpha=1.1$. Thus, dummy battery 54m is discharged at a rate equal to 1.1 of that of the main battery 52. Thus, when dummy battery 54m has been discharged, the main battery 52 will have a predetermined percentage of full capacity, specifically (1−1.0/1.1) or 9% of full capacity.

With the exemplary values of $R_D$ of sense resistors 66a–66m shown in FIG. 9, dummy batteries 54c, 54b, and 54a will discharge when the main battery 52 is about 25%, 50%, and 75% full, respectively, as illustrated in the following table. Those skilled in the art will understand that other values of the sense resistors can achieve similar results or other desired results.

TABLE I

| Dummy Battery | α | $R_D$ | $\beta = R_M/R_D$ | β/α | C = (1 − α/β) |
|---|---|---|---|---|---|
| 54a | 0.01 | 2.75 Ω | 0.04 | 4 | 75% |
| 54b | 0.01 | 5.50 Ω | 0.02 | 2 | 50% |
| 54c | 0.01 | 8.25 Ω | 0.01333 | 4/3 | 25% |
| 54m | 0.01 | 10.0 Ω | 0.011 | 1.1 | 9% |

In this exemplary embodiment, as there are four dummy batteries 54a–54m in each with an area of about 1% of that of the main battery 52, the capacity of the fuel gauge 50 is reduced to about 10 0/10 4≈96% of what it would be without being configured as a fuel gauge.

In view of the foregoing, the storage device of the present invention sacrifices a predetermined percentage (e.g., 1% to 5%) of the area and, therefore, capacity of a thin-film solid electrolyte battery for use as a fuel gauge. Power to the load 18 is provided by the remaining capacity (e.g., 95% to 99%) of the storage device. The load current is reflected in a current mirror, which discharges the dummy battery at a rate slightly greater than the rate at which the remaining battery is discharged. Therefore, the dummy battery will be discharged earlier than the main battery. When the dummy battery has been discharged, a warning may be issued to indicate that the battery is nearing the end of its capacity.

The batteries (collectively the main and dummy batteries) of the storage devices of the present invention are preferably lithium-based solid-electrolyte thin-film batteries. The batteries may be nonrechargeable (i.e., primary cells) or rechargeable (i.e., secondary cells). The batteries may be configured in any shape (e.g., rectangular, circular, triangular, trapezoidal, regular, or irregular), any size (e.g., 2 centimeters by 3 centimeters or 15 centimeters by 20 centimeters), or any thickness (e.g., 1 millimeter to 2 millimeters). The batteries may be flexible and foldable. In addition to the portable computer 10 illustrated in FIG. 2, the storage devices of the present invention may power any type of electronic appliance requiring power, including portable and stationary devices. Such devices may include, for example, image-recording devices (including digital cameras, video cameras, and so on), portable instrumentation, and medical instrumentation.

The discharge circuitry of the storage devices may be permanently connected to the main and dummy batteries or may be releasably connected with a socket-type arrangement; that is, the discharge circuitry may form an integral component or an attachable component of the storage device. Alternatively, the discharge circuitry may be a component of the device being powered by the main battery; for example, the discharge circuitry may be an element of (i.e., built into) the portable computer 11.

Those skilled in the art will understand that the present invention is not limited to the specifically illustrated and described embodiments above. The scope of the present invention is determined by the terms of the appended claims and their legal equivalents, rather than by the examples described above.

What is claimed is:

1. A storage device for providing power to a load, said storage device comprising:
    a main battery connectable to the load, said main battery having a storage capacity and a self-discharge rate;
    a dummy battery having a storage capacity and a self-discharge rate, said storage capacity of said dummy battery being less than said storage capacity of said main battery, said self-discharge rate of said dummy battery being substantially equal to said self-discharge rate of said main battery; and
    discharge circuitry for discharging said dummy battery at a rate faster than said main battery when the load is drawing current from said main battery.

2. A storage device as claimed in claim 1 wherein said batteries are thin-film batteries each having an area;
    said area of said dummy battery being a predetermined percentage of said area of said main battery;
    said predetermined percentage being less than about 5%.

3. A storage device as claimed in claim 1 wherein said discharge circuitry causes said dummy battery to discharge about 10% more quickly than said main battery.

4. A storage device as claimed in claim 1 wherein said storage capacity of said dummy battery is less than about 5% of said storage capacity of said main battery.

5. A storage device as claimed in claim 1 wherein said discharge circuitry includes:
    a sense resistor connected to said main battery; and
    a sense resistor connected to said dummy battery.

6. A storage device as claimed in claim 1 wherein:
    said main battery and said dummy battery are thin-film batteries; and
    said dummy battery is configured as a strip.

7. A storage device as claimed in claim 1 wherein:
    said main battery and said dummy battery are thin-film batteries; and
    said dummy battery is configured as a cell.

8. A storage device as claimed in claim 1 wherein said discharge circuitry includes an operational amplifier, a transistor, and a resistor configured as a current mirror.

9. A storage device as claimed in claim 1 further comprising at least one additional dummy battery;
    said discharge circuitry discharging said at least one additional dummy battery at a rate faster than said main battery when the load is drawing current from said main battery.

10. A storage device as claimed in claim 9 wherein said discharge circuitry is configured so that each of said dummy batteries is discharged at a different rate.

11. A storage device as claimed in claim 1 further comprising signaling circuitry for providing a signal when said dummy battery has discharged below a predetermined threshold.

12. An electronic appliance comprising:
    a storage device including:
        a main battery for providing power to said electronic appliance, said main battery having a storage capacity and a self-discharge rate;
        a dummy battery having a storage capacity, a self-discharge rate, and a state of charge, said storage capacity of said dummy battery being less than said storage capacity of said main battery, said self-discharge rate of said dummy battery being substantially equal to said self-discharge rate of said main battery; and discharge circuitry connected to said dummy battery and configured so that said dummy battery discharges at a rate faster than said main battery when a load is connected to said main battery; and signaling circuitry connected to said storage device for monitoring said state of charge of said dummy battery, said signal circuitry providing a signal when said state of charge of said dummy battery is less than a predetermined threshold; and a signal device connected to said signaling circuitry for receiving said signal.

13. An electronic appliance as claimed in claim 12 wherein said appliance is a portable computer.

14. An appliance as claimed in claim 12 wherein:

said main battery and said dummy battery are thin-film batteries; and said dummy battery is configured as a strip.

15. An appliance as claimed in claim 12 wherein:

said main battery and said dummy battery are thin-film batteries; and said dummy battery is configured as a cell.

16. An appliance as claimed in claim 12 wherein said dummy battery discharges about 10% more quickly than said main battery when being discharged by the appliance.

17. An appliance as claimed in claim 12 wherein said storage capacity of said dummy battery is less than about 5% of said storage capacity of said main battery.

18. A method for providing a state of charge of a storage device, said method comprising the steps of:

discharging a main battery at a first discharge rate;

discharging a dummy battery at a second discharge rate, said second discharge rate being greater that said first discharge rate;

monitoring a state of charge of said dummy battery; and signaling when said state of charge of said dummy battery is below a predetermined level.

19. A method as claimed in claim 18 wherein said step of discharging a dummy battery comprises the step of:

discharging a dummy battery at a second discharge rate, said second discharge rate being at least about 5% greater than said first discharge rate.

20. A method as claimed in claim 18 wherein:

said step of discharging a main battery further comprises the step of discharging a main battery having a storage capacity; and said step of discharging a dummy battery further comprises the step of discharging a dummy battery having a storage capacity, said storage capacity of said dummy battery being less than about 5% of said storage capacity of said main battery.

* * * * *